(12) United States Patent
Oliva

(10) Patent No.: US 6,665,125 B2
(45) Date of Patent: *Dec. 16, 2003

(54) OPTICAL DEVICE AND METHOD FOR FOCUSING A LASER BEAM

(75) Inventor: Guido Maurizio Oliva, Rovigo (IT)

(73) Assignee: Datalogic, S.p.A., Bologna (IT)

( * ) Notice: Subject to any disclaimer, the term of this patent is extended or adjusted under 35 U.S.C. 154(b) by 0 days.

This patent is subject to a terminal disclaimer.

(21) Appl. No.: 09/929,044

(22) Filed: Aug. 15, 2001

(65) Prior Publication Data

US 2002/0003670 A1 Jan. 10, 2002

Related U.S. Application Data

(63) Continuation of application No. 09/400,864, filed on Sep. 21, 1999, now Pat. No. 6,339,504.

(30) Foreign Application Priority Data

Nov. 10, 1998 (EP) ............................................. 98830676

(51) Int. Cl.⁷ .............................. G02B 9/00; G02B 13/18
(52) U.S. Cl. ....................... 359/648; 359/641; 359/708; 359/651; 359/718
(58) Field of Search ................................. 359/641, 708, 359/651, 718, 648

(56) References Cited

U.S. PATENT DOCUMENTS

| | | | |
|---|---|---|---|
| 4,734,906 A | * 3/1988 | Baer et al. .................. | 363/112 |
| 5,237,451 A | 8/1993 | Saxe ........................... | 359/565 |
| 5,373,395 A | 12/1994 | Adachi ........................ | 359/652 |
| 5,483,362 A | * 1/1996 | Tai et al. ..................... | 359/1 |
| 5,572,367 A | 11/1996 | Jung et al. .................. | 359/708 |
| 5,663,980 A | * 9/1997 | Adachi ........................ | 372/108 |
| 5,742,038 A | 4/1998 | Dvorkis et al. ............. | 235/462 |
| 5,790,576 A | 8/1998 | Waarts et al. ................ | 372/43 |
| 5,801,869 A | * 9/1998 | Yoshikawa et al. ......... | 359/208 |
| 6,088,170 A | * 7/2000 | Lee et al. .................... | 359/710 |
| 6,094,515 A | * 7/2000 | Miki et al. ................... | 385/31 |
| 6,339,504 B1 | * 1/2002 | Oliva .......................... | 359/641 |

FOREIGN PATENT DOCUMENTS

| | | |
|---|---|---|
| DE | 4 218 795 | 10/1999 |
| EP | 0 310 711 | 4/1989 |
| EP | 0 312 652 | 4/1989 |
| EP | 0 752 680 | 1/1997 |

* cited by examiner

*Primary Examiner*—Scott J. Sugarman
*Assistant Examiner*—M. Hasan
(74) *Attorney, Agent, or Firm*—Nixon & Vanderhye, P.C.

(57) ABSTRACT

The invention relates to an optical device for focusing a substantially elliptical laser beam comprising: means for collimating a substantially elliptical laser beam so to generate a collimated beam of substantially elliptical profile; means for circularizing the collimated beam so to generate a beam of substantially circularized profile; and means for focusing the circularized beam. The device according to the invention allows on one side to achieve better results in terms of increasing the depth of focus and overall efficiency of the system, and on the other side to allow reading of optical codes also when these are tilted with respect to the scan direction of an angle up to 45° (tilt angle).

9 Claims, 5 Drawing Sheets

OPTICAL DEVICE AND METHOD FOR FOCUSING A LASER BEAM

This application is a continuation of application Ser. No. 09/400,864, filed Sep. 21, 1999, now U.S. Pat. No. 6,339,504 the entire content of which is hereby incorporated by reference in this application.

BACKGROUND OF THE INVENTION

1. Field of the Invention

The present invention relates to an optical device and a method for focusing a laser beam. More specifically, the present invention relates to an optical device and a method for focusing a substantially elliptical laser beam, such as for example that one generated by a laser diode.

Preferably, but not exclusively, the device according to the invention is intended for use in an optical reader (for example an optical code reader) in order to increase the laser beam depth of focus.

2. Discussion of Prior Art

As known, an optical code reader is essentially comprised of a reader device, commonly named scanner, comprising a laser beam emitting source (typically a laser diode) intended to illuminate the code to be decoded along a reading line and a light-sensitive element intended to collect the light diffused by the points of such line and generate in turn an analog electrical signal proportional to the light intensity itself. The generated analog signal is then converted into a digital signal, which is processed by a decoding software, which finally provides the sequence of decoded characters of the read optical code.

In order to allow reading and decoding of the optical code, it is necessary that the scanner is further provided with an optical element capable of focusing the laser beam at the distance at which the code to be read is positioned. Typically, such optical element is comprised of a converging lens provided downstream of the laser diode and designed to collect the diverging laser beam emitted from this and focusing it at a predetermined distance; the focused beam is then deflected by means of a rotating polygon (or alternatively by means of an oscillating mirror or by means of an alternate movement of the laser source itself) so to obtain a code scan along the reading line.

Especially in the object handling and sorting plants, there is the problem of being able to read optical codes whose distances and tilts, with respect to the scan line of the scanner, can be very different between each other. In such situations, the use of a laser beam scanner of the above mentioned type not always allows to correctly focus the codes.

SUMMARY OF THE INVENTION

Throughout this description and the appended claims, the term: "optical code" is used to indicate a code (such as for example a bar code, a two-dimensional code, a color code or the like) containing coded information (for example relative to the objects on which it is provided). Hereinbelow, reference will be made to bar codes, merely in order to make the description more clear.

The inventors of the present invention have studied how to increase the depth of focus of a laser beam emitted by a laser diode through comparative tests on scanners provided with different optical elements and have surprisingly found how such a result is achievable paying specific attention to the form of the laser beam profile.

Hence in a first aspect thereof, the present invention relates to an optical device for focusing a substantially elliptical laser beam, characterized by comprising:
 means for collimating a substantially elliptical laser beam so to generate a collimated beam of substantially elliptical profile;
 means for circularizing the collimated beam so to generate a beam of substantially circularized profile;
 means for focusing the circularized beam.

It has been experimentally proved that it is possible to achieve the best results in terms of increase of depth of focus and overall system efficiency associating the laser diode and the collimating and focusing means with additional means designed for circularizing the collimated beam, so to generate a circularized and confined beam, which shall be then focused on the code to be read.

The use of a laser diode as emitting source is still broadly popular in the field of optical code reading. But such practice, if on one side permits to achieve an advantage in terms of costs, on the other side implies that a diverging beam having elliptical profile shall be emitted.

Advantageously, the presence of the circularizing means allows to overcome the drawback associated to the laser diode scanners of known type, related to the presence of a collimated beam with elliptical profile and therefore of a light footprint having different size on the two perpendicular axis. In fact, as known, the reading of bar codes implies that the footprint size in the reading direction is smaller than the minimum width between those of the narrowest bar and the narrowest space; therefore, an elliptical light footprint could imply the possibility of carrying out an adequate reading only along a determined scan direction. Differently, the presence of a circular beam (and hence of a footprint having the same dimensions in all directions) allows to overcome such drawback, allowing therefore the reading of the codes also when these are tilted with respect to the scan direction of an angle up to 45° (tilt angle).

Advantageously, the means for collimating the laser beam comprises, alternatively, a refracting or diffracting lens with a spherical or aspherical profile.

Advantageously, the means for circularizing the collimated beam comprise, alternatively, an anamorphic prism, a pair of anamorphic prisms, a cylindrical mirror tilted of an angle comprised between 0° and 90° with respect to the propagation direction of the collimated beam, or a pair of cylindrical mirrors, each one tilted of an angle comprised between 0° and 90° with respect to the propagation direction of the collimated beam.

In further alternative embodiments of the present invention, the means for circularizing the collimated beam comprise a diffraction grating tilted of an angle comprised between 0° and 90° with respect to the propagation direction of the collimated beam or a pair of diffraction gratings, of which at least one is tilted of an angle comprised between 0° and 90° with respect to the propagation direction of the collimated beam.

Advantageously, the circularization of the laser beam takes place through an anamorphic enlargement carried out by the aforesaid optical elements. Through a careful design of such elements it is furthermore possible to minimize the residual astigmatism of the laser beam, thus assuring an effective reading on a remarkably broad reading range, also in case of optical codes tilted with respect to the scan direction.

The means for focusing the circularized beam comprise alternatively a converging refractive or diffractive or Fresnel lens, with either a fixed focal length or a multifocal or a slightly toric one.

Advantageously, the use of a focusing diffractive lens in place of a refractive one allows to overcome the drawbacks related to the need of having a lens with very long focal and very small diameter with respect to the focal length, what makes the centering and the control of the precision in the lens manufacture difficult, and hence, at last, the control of the focal length. The intrinsic precision of the method for manufacturing a diffractive lens advantageously allows to control with very high precision both the centering and the focal, and furthermore allows to introduce on the lens an aspherical, toric or multi-focal profile more easily than in case of a refractive lens.

In alternative, the means for focusing the circularized beam comprise a toric mirror tilted of an angle between 0° and 90° with respect to the propagation direction of the circularized beam.

In further alternative embodiments of the present invention, the means for collimating, circularizing and focusing the beam comprise a pair of cylindrical refractive or diffractive or Fresnel lenses with spherical or aspherical profile, or a single toric refractive or diffractive lens, with spherical or aspherical profile.

The use of toric surfaces advantageously allows to carry out the anamorphic enlargement and the focusing (otherwise effected by the focusing lens) by means of a single optical element.

In a second aspect thereof, the invention relates to a method for focusing a laser beam of substantially elliptical profile, comprising the following steps:

a) collimating a substantially elliptical laser beam in such a way to have a collimated beam of substantially elliptical profile;

b) circularizing the collimated beam so to have a beam of substantially circularized profile;

c) focusing the circularized beam.

BRIEF DESCRIPTION OF THE DRAWINGS

Further features and advantages of the present invention will appear more clearly from the following detailed description of a preferred embodiment, made with reference to the attached drawings. In such drawings.

DETAILED DISCUSSION OF PREFERRED EMBODIMENTS

Figure 1:
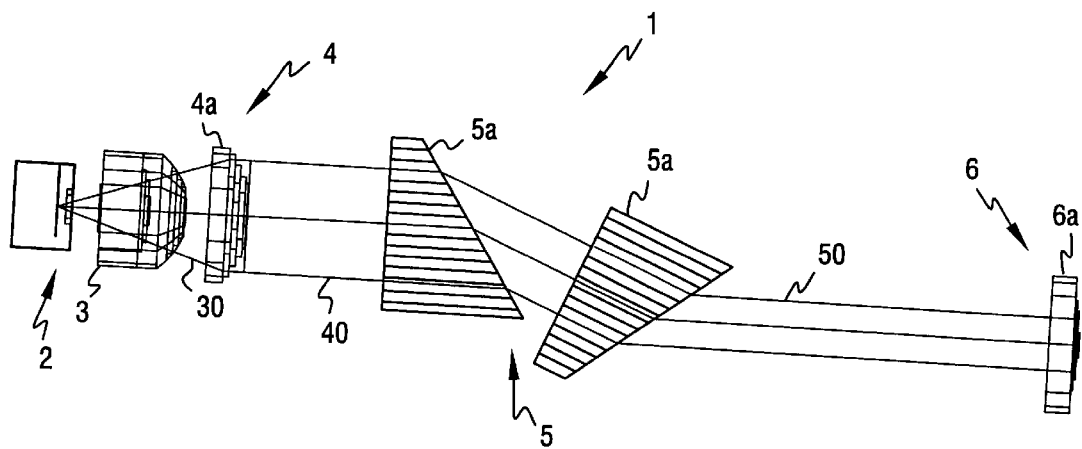
FIG. 1 shows a schematic illustration of a first embodiment of the device of the present invention.

In FIGS. 1 to 7, numeral 1 indicates an optical device for focusing a laser beam according to the present invention.

The device 1 is designed for being used in an optical reader (for example an optical code reader) in order to increase the depth of focus of the laser beam, so to allow the reading of information positioned at different distances with respect to the reader itself.

The device 1 comprises means 2 for generating a diverging laser beam which will be subsequently collimated and focused at a predetermined reading distance. The means 2, in particular, comprise a laser source, typically a semiconductor laser diode, intended to emit a diverging, astigmatic and with a substantially elliptical profile laser beam 30. Downstream of the laser diode 2, the device 1 of the invention comprises means 3, 4 for collimating the substantially elliptical beam 30 so to generate a substantially elliptical collimated beam 40 (collimated gaussian beam)

According to the present invention, the device 1 comprises, downstream of the collimating means 3, 4, means 5 for circularizing the elliptical collimated beam 40 so to generate a circularized beam 50 and means 6 for focusing the circularized beam 50 at the predetermined reading distance.

The collimating means 3, 4, the circularizing means 5 and the focusing means 6 can comprise different optical elements, all suitable for achieving the object of the present invention, which is that of obtaining a circularized beam free of astigmatism, without remarkably affecting the efficiency of the reading system.

For example, the collimating means 3, 4 comprise a single refractive lens 4a (of a per se known type) as shown in FIGS. 1–4; such lens 4a can have a curvature on one or both axis to correct the possible astigmatism of the laser beam 30 and can have a spherical or aspherical profile.

Alternatively, the collimating means 3, 4 comprise a diffractive lens (of a per se known type) with spherical or aspherical profile.

In a first embodiment of the device according to the present invention, shown in FIG. 1, the circularizing means 5 comprise a pair of anamorphic prisms, both indicated with 5a, for circularizing the collimated elliptical beam 40 so to generate the circularized beam 50 and directing it then to the focusing means 6. These last means are circular in shape, that is such to have a circular section in a perpendicular plane with respect to the propagation direction of the circularized beam 50 and comprise alternatively a converging refractive, diffractive or Fresnel lens (indicated with 6a in the drawings), with either a fixed focal length or a multifocal or a slightly toric one (all of known type).

Figure 8:
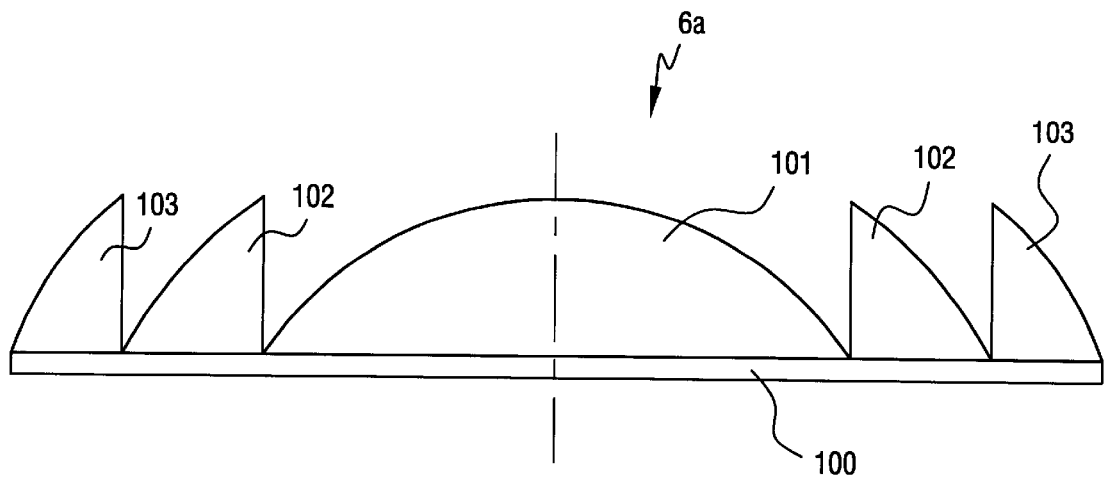
FIG. 8 shows a schematic view in section of an optical element which can be used in the device of the present invention.
Figure 9:
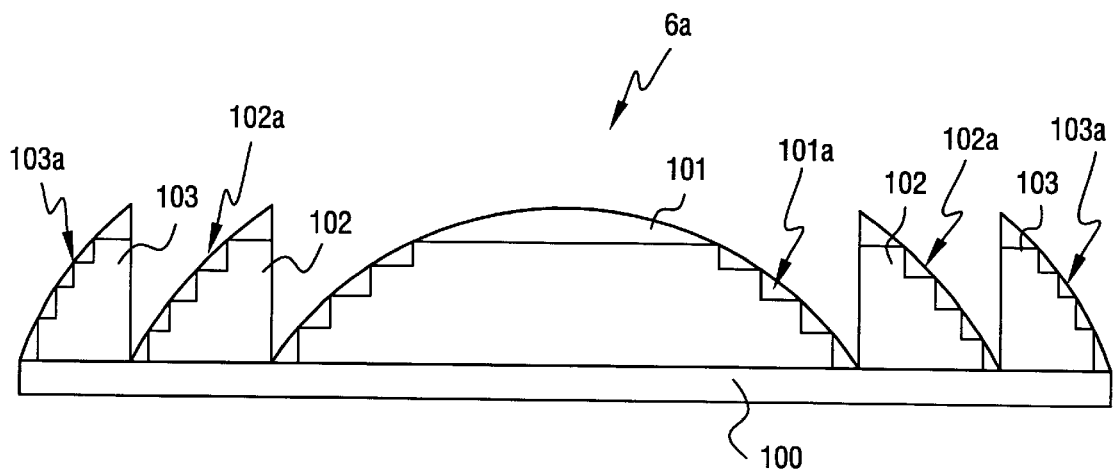
FIG. 9 shows a schematic enlarged view in section of the element of FIG. 8.

FIGS. 8 and 9 show in greater detail the constructive features of a diffractive lens 6a which can be used in the device of the present invention in order to allow the focusing of the laser beam. Such lens is a diffractive optical element (DOE) whose constructive features are known and described, for example, in the U.S. Pat. No. 5,073,007. In order to make the description easy, such constructive features will only be shortly mentioned in this context with reference to FIGS. 8 and 9.

From these drawings it can be noticed that the DOE consists of a glass, plastics or fused silica substrate 100 of 1–2 mm of thickness; on one of the faces thereof a central portion 101 was created comprising a plurality of steps 101a (FIG. 9) which approximate a continuous profile of parabolic cap of a paraboloid and a plurality (two in the figures) of concentric annular portions 102 and 103, each comprising a plurality of steps 102a, 103a (FIG. 9) which approximate a continuous profile of truncated sections of the paraboloid itself: The numbers of steps is equal to a power of 2 and each zone of the DOE presents the same number of steps. The number of portions 102 and 103 varies in function both of the diameter and of the focal length of the DOE, and in function of the wavelength of the incident radiation.

The DOE acts as a focusing element extremely flexible in the adjustment of the focusing characteristics of the circularized beam 50. The way by which the DOE operates, is described, for example in U.S. Pat. No. 5,646,391 and are not repeated in this context in order to make the description easier. In particular, in the specific case of a DOE having a continuous paraboloidic profile, approximated by means of a plurality of steps, a paraboloidic phase transformation is carried out on the circularized beam 50, introducing for each step a phase shift equal to a fraction of $2\pi$ according to the thickness of each of them, thus enabling the focusing of the circularized beam 50 itself (at an increased depth of focus).

Figure 2:
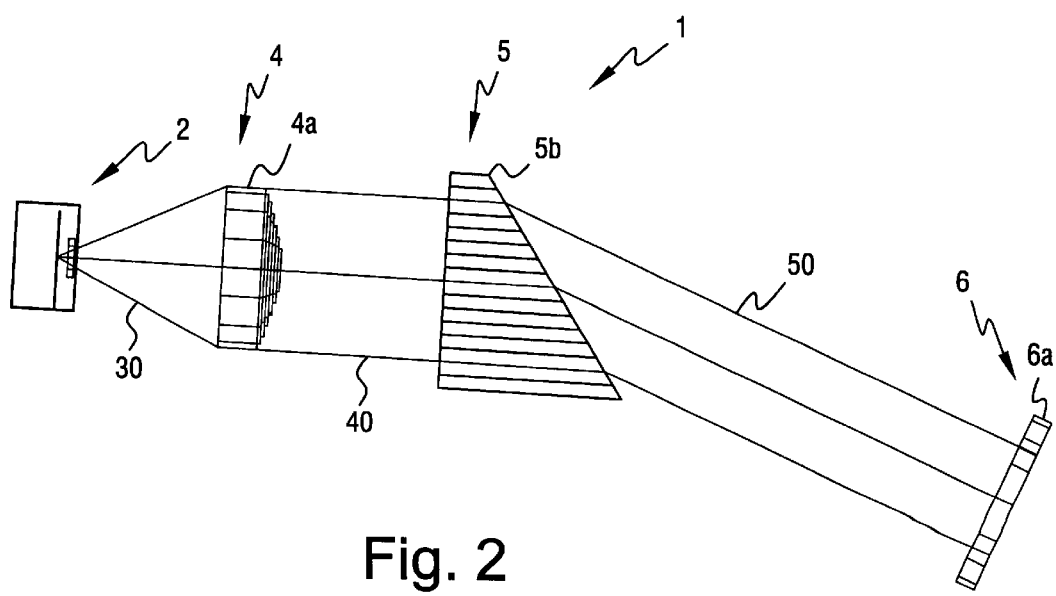
FIG. 2 shows a schematic illustration of a second embodiment of the device of the present invention.

In a second embodiment of the device 1, shown in FIG. 2, the circularizing means 5, comprise a single anamorphic prism, indicated with 5b.

Figure 3:
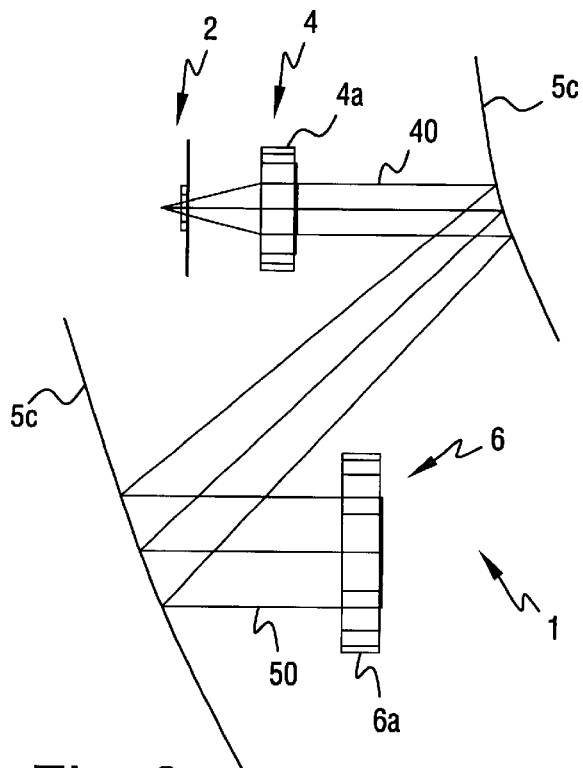
FIG. 3 shows a schematic illustration of a third embodiment of the device of the present invention.

In a third embodiment of the device 1, shown in FIG. 3, the circularizing means 5, comprise a pair of cylindrical mirrors, both indicated with 5c, each one of which is tilted of an angle comprised between 0° and 90° with respect to the propagation direction of the collimated beam 40. Alternatively, the pair of cylindrical mirrors can be replaced with a single cylindrical mirror suitably tilted.

Figure 4:
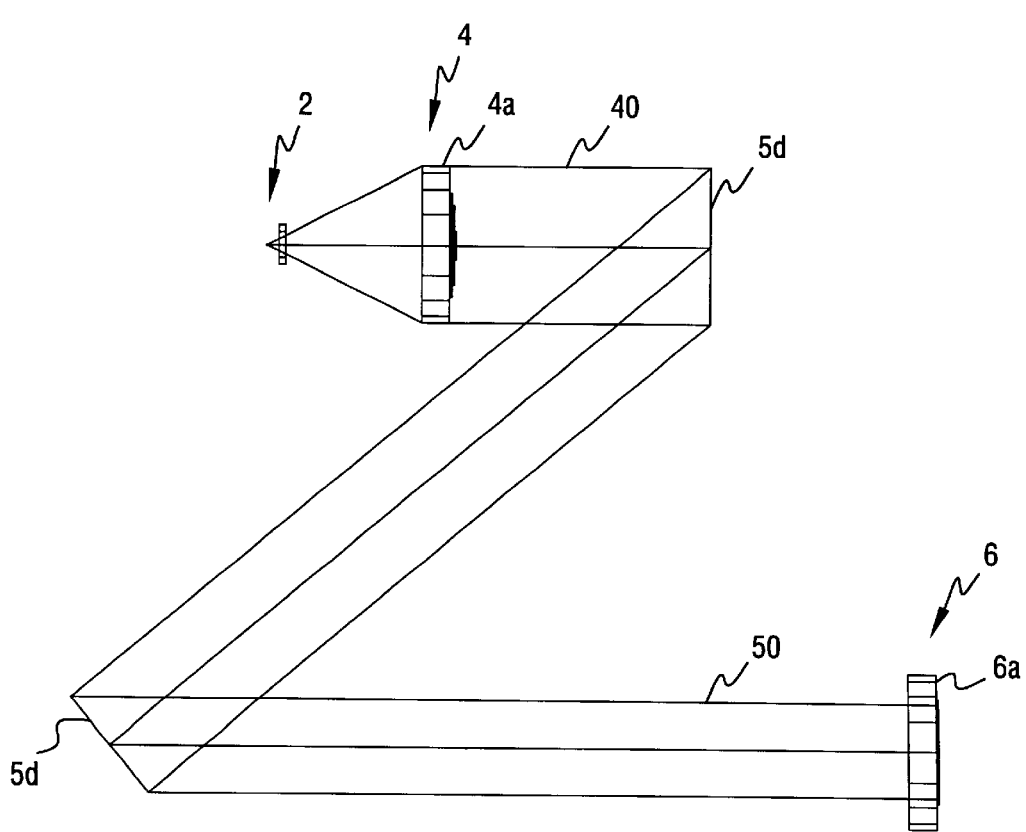
FIG. 4 shows a schematic illustration of a fourth embodiment of the device of the present invention.

In a fourth embodiment of the device 1, shown in FIG. 4, the circularizing means 5 comprise a pair of diffraction gratings, both indicated with 5d, of which at least one is tilted of an angle comprised between 0° and 90° with respect to the propagation direction of the collimated beam 40. Alternatively, the pair of diffraction gratings can be replaced with a single diffraction grating suitably tilted.

The focusing means 6 can consist of optical elements alternative to those above mentioned. For example, in a further embodiment (not shown) of the device 1 of the present invention, the focusing means 6 comprise a toric mirror tilted of an angle comprised between 0° and 90° with respect to the propagation direction of the circularized beam 50.

Figure 5:
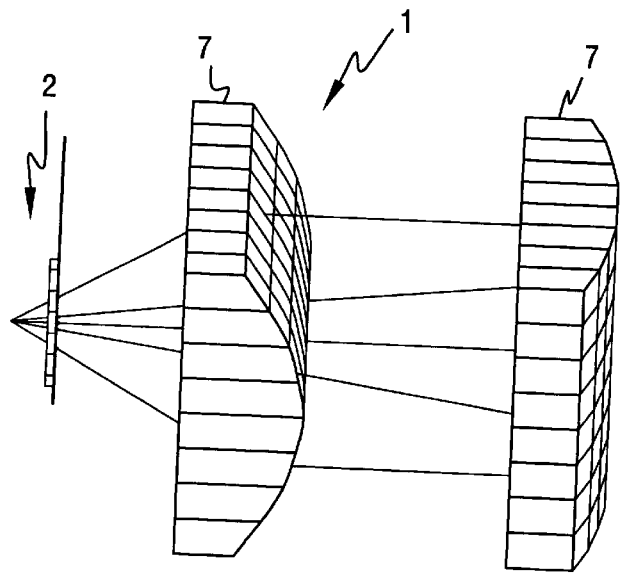
FIG. 5 shows a schematic illustration of a fifth embodiment of the device of the present invention.
Figure 6:
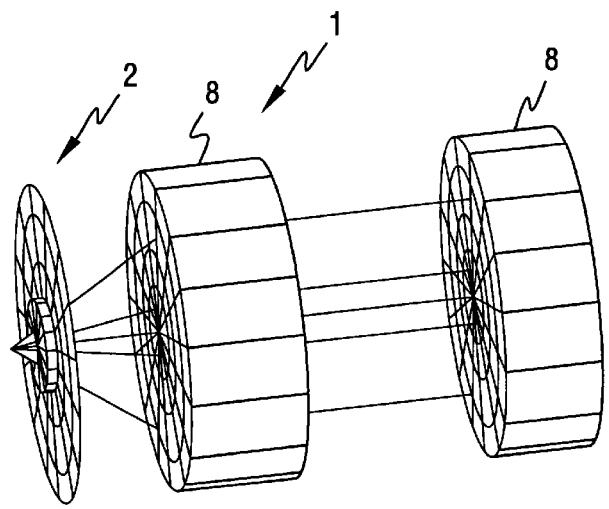
FIG. 6 shows a schematic illustration of a sixth embodiment of the device of the present invention.
Figure 7:
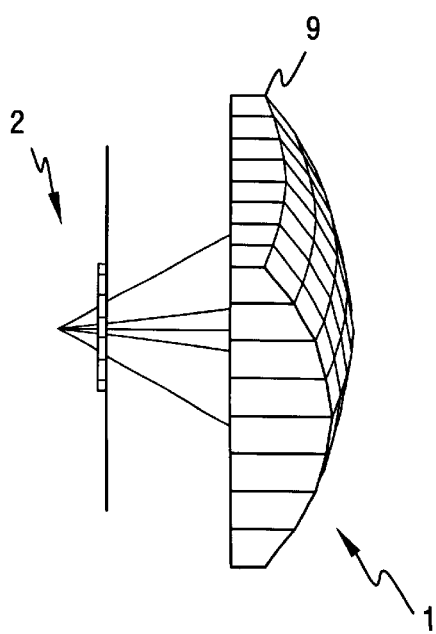
FIG. 7 shows a schematic illustration of a seventh embodiment of the device of the present invention.
Figure 10:
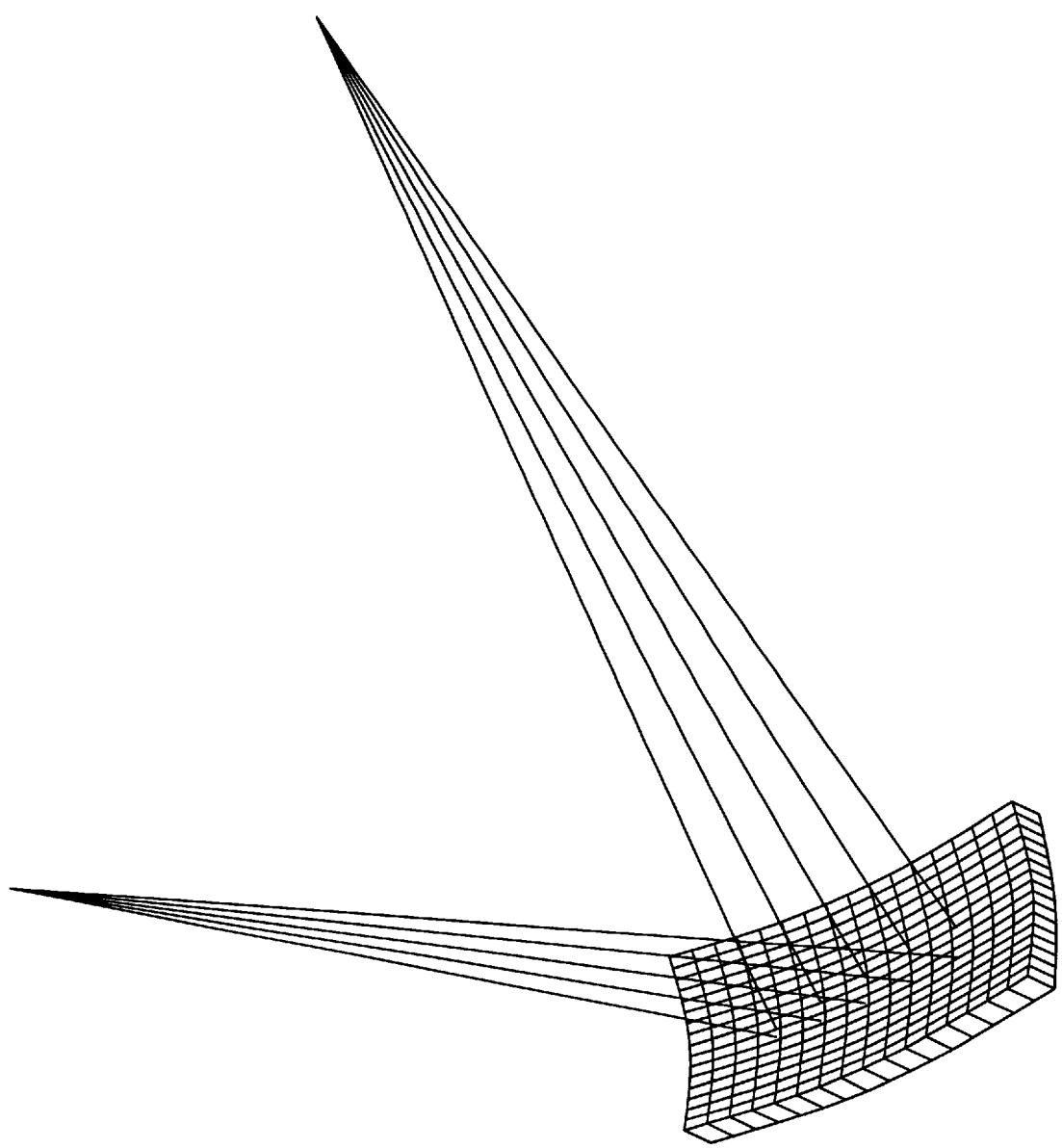
FIG. 10 shows a toric mirror used in one embodiment of the present invention.

In further alternative embodiments of the present invention, illustrated in FIGS. 5 to 7, the means for collimating, circularizing and focusing the beam comprise uniquely a pair of cylindrical refractive 7 (FIG. 5), or diffractive 8 (FIG. 6) or Fresnel lenses with spherical or aspherical profile, or a single refractive or diffractive toric lens 9 (FIG. 7) with spherical or aspherical profile or a toric mirror (FIG. 10).

With specific reference to FIG. 1, in operation the semiconductor laser diode 2 generates a diverging elliptical laser beam 30 that is collected by the collimating lens 4a, which generates a collimated elliptical beam 40. Such beam 40 is first circularized by means of the pair of anamorphic prisms 5a and then directed to the focusing lens 6a which "focuses" the laser beam on the intended reading area.

The device according to the present invention, as above described, allows to achieve various advantages, inter alia those listed hereinbelow:
  increase of the depth of focus of the laser beam;
  decrease of the losses in optical efficiency of the overall system
  possibility of reading in any direction, also in presence of tilt angles.

What is claimed is:

1. Optical device for focusing a substantially elliptical laser beam comprising:
  means for collimating a substantially elliptical laser beam so to generate a collimated beam of substantially elliptical profile;
  means for circularizing the collimated beam so to generate a beam of substantially circularized profile;
  means for focusing the beam of circularized profile, wherein the means for circularizing the collimated beam comprise only a single cylindrical mirror tilted at an angle of between 0° and 90° with respect to a propagation direction of the collimated beam.

2. Optical device for focusing a substantially elliptical laser beam comprising:
  means for collimating a substantially elliptical laser beam so to generate a collimated beam of substantially elliptical profile;
  means for circularizing the collimated beam so to generate a beam of substantially circularized profile;
  means for focusing the beam of circularized profile, wherein the means for focusing the circularized beam comprise only a single toric mirror tilted at an angle of between 0° and 90° with respect to a propagation direction of the circularized beam.

3. Optical device for focusing a substantially elliptical laser beam comprising:
  means for collimating a substantially elliptical laser beam so to generate a collimated beam of substantially elliptical profile;
  means for circularizing the collimated beam so to generate a beam of substantially circularized profile;
  means for focusing the beam of circularized profile, wherein the means for collimating, circularizing and focusing the laser beam comprise only a single pair of cylindrical lenses, said cylindrical lenses selected from the group of refractive lenses, diffractive lenses and Fresnel lenses.

4. Optical device for focusing a substantially elliptical laser beam comprising:
  means for collimating a substantially elliptical laser beam so to generate a collimated beam of substantially elliptical profile;
  means for circularizing the collimated beam so to generate a beam of substantially circularized profile;
  means for focusing the beam of circularized profile, wherein the means for collimating, circularizing and focusing the laser beam comprises only a single toric lens, said toric lens is selected from the group of a refractive toric lens and a diffractive toric lens, said toric lens having one of a spherical and aspherical profile.

5. An optical reader for reading optical codes placed at varying distances from said reader, said reader including a substantially elliptical laser beam and an optical device for focusing said laser beam, said device comprising:
  means for collimating said substantially elliptical laser beam so to generate a collimated beam of substantially elliptical profile;
  means for circularizing the collimated beam so as to generate a beam of substantially circularized profile;
  means for focusing the beam of circularized profile, wherein said means for focusing the laser beam comprises a lens having a relatively great focal length.

6. An optical reader in accordance with claim 5, wherein the means for circularizing the collimated beam comprises at least one cylindrical mirror tilted at an angle of between 0° and 90° with respect to a propagation direction of the collimated beam.

7. An optical reader in accordance with claim 5, wherein the means for circularizing the collimated beam comprises at least one diffraction grating tilted at an angle of between 0° and 90° with respect to a propagation direction of the collimated beam.

8. Method of reading an optical code placed at a variable distance from an optical reader where the optical reader includes a laser beam having a substantially elliptical profile and an optical device for focusing said laser beam of substantially elliptical profile, comprising the following steps:

a) collimating said substantially elliptical laser beam to provide a collimated beam of substantially elliptical profile;

b) circularizing the collimated beam so as to provide a beam of substantially circularized profile; and c) focusing the circularized beam, wherein said focusing step utilizes a lens having a relatively great focal length.

9. Method for focusing a laser beam of substantially elliptical profile, comprising the following simultaneously executed steps:

a) collimating a substantially elliptical laser beam to provide a collimated beam of substantially elliptical profile;

b) circularizing the collimated beam so as to provide a beam of substantially circularized profile; and c) focusing the circularized beam.

* * * * *